United States Patent
Kluwe et al.

[11] Patent Number: 5,899,706
[45] Date of Patent: May 4, 1999

[54] METHOD OF REDUCING LOADING VARIATION DURING ETCH PROCESSING

[75] Inventors: Andreas Kluwe, Essex Junction, Vt.; Lars Liebmann, Poughquag, N.Y.; Frank Prein, Glen Allen, Va.; Thomas Zell, Dresden, Germany

[73] Assignees: Siemens Aktiengesellschaft, Munich, Germany; International Business Machines Corporation, Armonk, N.Y.

[21] Appl. No.: 08/884,862

[22] Filed: Jun. 30, 1997

[51] Int. Cl.[6] .................................................. H01L 21/82
[52] U.S. Cl. ........................... 438/129; 438/599; 438/926
[58] Field of Search ............................. 438/15, 128, 129, 438/599, 800, 926

[56] References Cited

U.S. PATENT DOCUMENTS

| | | |
|---|---|---|
| 4,941,031 | 7/1990 | Kumagai et al. ........................ 257/296 |
| 5,132,237 | 7/1992 | Matthews . |
| 5,262,354 | 11/1993 | Cote et al. ............................... 438/645 |
| 5,278,105 | 1/1994 | Eden et al. . |
| 5,770,884 | 6/1998 | Pogge et al. ............................... 438/15 |

*Primary Examiner*—Kevin M. Picardat
*Attorney, Agent, or Firm*—Stanton C. Braden

[57] ABSTRACT

In preparation for etch processing a semiconductor chip having areas of little or no pattern and areas that are heavily patterned, adding non-operative patterns to the areas having little or no pattern so that the overall pattern density is about the same across the chip.

1 Claim, 3 Drawing Sheets

METHOD OF REDUCING LOADING VARIATION DURING ETCH PROCESSING

This invention relates to semiconductor device fabrication and, more particularly, to reducing loading variation during etch processing.

BACKGROUND OF THE DISCLOSURE

Many devices are currently integrated on a single die or chip. These devices are arranged in various configurations on the chip. The arrangement of the devices is referred to as a layout. Typically, the layout includes active areas with devices and inactive areas which are not used for devices. For example, a memory chip comprises densely packed arrays of transistors and storage nodes (memory cells), and loosely packed transistors (support circuitry), built-in fuses, bond pads and the like. The devices are connected to each other by means of conductive lines to form integrated circuits. As such, the overall chip layout includes areas having densely packed, complex arrays of devices, areas with less densely packed devices, and other areas that have no devices. Areas on the chip that are not occupied by electrically functional structures might be filled with electrically inactive unpatterned areas for planarization purposes. The resulting chip thus has several areas, some of which have a much higher pattern density than other areas. The size of devices on a single chip can also vary widely as well.

It is known that certain processing steps, such as etching, do not occur uniformly across a substrate, particularly when the number and placement of devices in an integrated circuit varies and the pattern density changes from one area of the integrated circuit to another. This phenomenon is well known as loading variation. Loading variation causes variations in the dimension of the resulting features and spaces that form the devices.

As design rules become smaller, e.g., to 0.25 micron and lower, variations in dimension caused by loading variation become more problematic. Variations in dimension across the chip or more commonly referred to as across chip linewidth variation (ACLV) causes timing control problems that negatively affect chip performance. Additionally, ACLV even affects the less densely Kerf areas where test structures and probe pads are placed for process monitoring. Variations in dimension of the test structures make it difficult to accurately monitor the manufacturing process of the chip.

ACLV as a result of loading principally depend upon the pattern density of surrounding features during an etch step or the pattern factor of the layer or material being etched. Pattern factor is defined as the ratio of patterned and unpatterned areas. Openings in areas of high pattern density tend to etch more anisotropically, producing openings with vertical sidewalls. When etching occurs in low pattern density areas, more deposits form on the sidewalls of the opening as etching continues, and the sidewalls produced are generally more tapered. Tapered openings cause linewidth variations from the top to the bottom of features, and produce a different "footprint", e.g., the opening is larger or smaller at a particular depth of etch, as shown in FIG. 1. In FIG. 1, opening 10 has been etched more anisotropically, producing an opening to the substrate 14 that has straight sidewalls and a particular dimension d1 that is uniform at any depth of etch.

Opening 20 has been etched with a slight taper, resulting in a smaller diameter opening at the substrate 14 than at the top. Thus the dimension d2 of the opening 20 is variable, and the "footprint" or diameter at the substrate 14 is not the same for opening 10 and opening 20, even though the diameter of the openings in the etch mask used to make them are the same. Thus the size or dimension of the openings in the etched layer can vary across the substrate. Such variations in dimensions can exceed specified tolerances, adversely affecting yield.

From the above discussion, it is desirable to avoid variations in dimension across the chip.

SUMMARY OF THE INVENTION

We have found that loading variation occurs within a chip during etching of complex and unlike patterns which can be eliminated or reduced by adding electrically nonfunctional or dummy patterns in the design to areas on the chip that are planar or otherwise less densely packed with devices than other areas. These dummy patterns do not have any function with respect to the devices other than making the pattern density across a chip more uniform and thus the etch more uniform, by eliminating varying sidewall passivation and other loading effects.

DETAILED DESCRIPTION OF THE INVENTION

The invention relates to the reduction of loading variation that occurs during an etch process. In device fabrication, insulating, semiconducting, and conducting layers are formed on a substrate. The layers are patterned to create features and spaces. The features and spaces are patterned so as to form components, such as transistors, capacitors, and resistors. These components are then interconnected to form an integrated circuit (IC) device.

Devices are typically fabricated in parallel on a semiconductor substrate such as a wafer. The wafer, for example, comprises silicon. Other semiconductor wafers, such as silicon on insulator (SOI), germanium, or gallium arsenide, are also useful. Once the devices are completed, the wafer is diced into individual chips comprising an IC. To simplify discussion of the invention, it is described in the context of a single IC.

In accordance with the invention, etching is generally done by plasma etching a material which includes, for example, silicon, polysilicon, or a dielectric layer such as silicon oxide. A developed or patterned photoresist layer serves as a mask for the etch process. The openings in the photoresist layer are etched by a desired plasma precursor etch gas, and the unexposed areas are protected from the etch gas by the mask.

The etch gas is chosen depending upon the profile of the openings desired. If straight walled openings are desired, an etch gas is chosen that will etch anisotropically. If tapered openings are desired, an etch gas is chosen that will etch while depositing a material, such as a polymer or a compound such as an oxide or a nitride and the like, on the sidewalls of the opening. During manufacture of an integrated circuit, various etch steps are carried out. Such etch steps include etching metal, silicon, silicides, silicon oxide, silicon nitride and the like using various conventional etchants.

Figure 2:
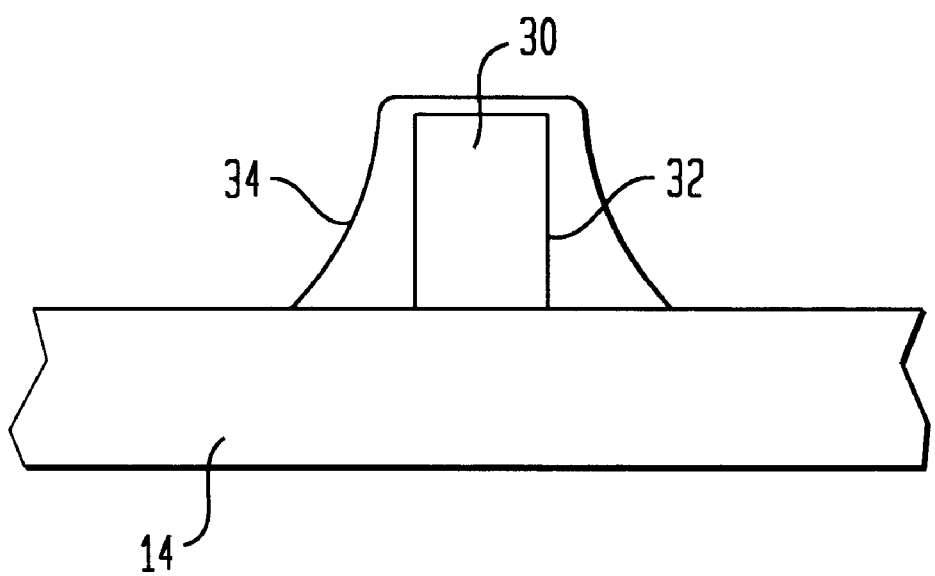
FIG. 2 is a cross sectional view of a prior art gate having a tapered sidewall dielectric layer thereover.

For example, transistor gates are made by depositing layers of conductive material, such as a silicide or polysilicon, and forming the gates by etching through a mask layer. Generally the gates are desired to have straight sidewalls, which requires an anisotropic etch. The formed gate is then protected against further processing by depositing a dielectric layer over the gate. This dielectric layer is etched to form tapered sidewall layers. These sidewall layers protect the substrate 14 on either side of the gate from damage from other processing steps, such as ion implantation. In such case, the etch gas is chosen to provide a tapered profile along the gate sidewalls. A typical conventional gate is shown in FIG. 2, wherein the conductive gate 30 has straight sidewalls 32 which is covered with a tapered dielectric layer 34.

When an opening is to be made between layers of devices separated by a dielectric layer, which opening is to be filled in with a conductive material such as aluminum, a more tapered profile is desired so the opening is smaller at the bottom of the opening that at the top. This permits easier filling by the conductive material without closing the top of the opening before the opening is completely filled. Thus the etchants are chosen so that the sidewalls are coated during the etch with a dielectric or polymeric material. Coating the sidewalls with a dielectric or polymeric material is known as passivation. As the etch progresses, more material is deposited on the etched sidewalls, to form a tapered sidewall. As such, passivation of the sidewalls influences the slope of the structure and therefore, the dimension of the opening at its foot or bottom. More passivation results in a structure having shallower sidewalls with smaller dimensions at its foot. Conversely, less passivation results in a structure having steeper sidewalls with larger dimensions at its foot.

Figure 1:
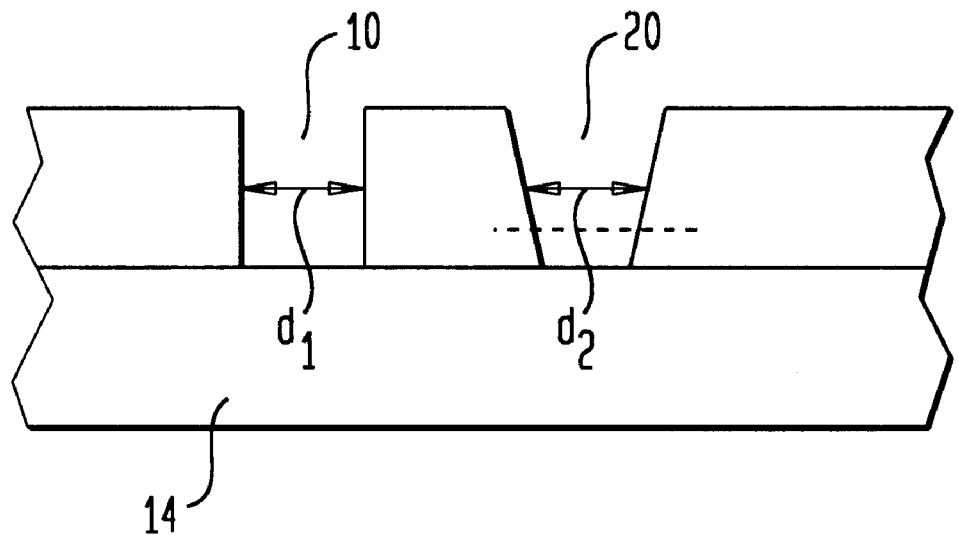
FIG. 1 is a cross sectional view of prior art anisotropically and tapered etched openings in a layer on a substrate.

To obtain openings which have a uniform dimension at the bottom of the openings, the etchant must deposit the same amount of material on the sidewalls, so that the dimension of all of the openings is substantially the same across the chip, and hence improved overall linewidth control within the integrated circuit is provided. As the dimension of the openings becomes smaller, variations in the sidewall passivation due to loading variation significantly affect the size and shape of openings and the operation of devices. The dimension of the openings at the bottom should be the same across the chip. However, if due to loading variation the amount of material deposited on the sidewalls of the opening is not the same across the chip, variations in the dimension at the bottom of the trenches occur, as shown by the dotted line in FIG. 1. Such variations in dimension, as previously discussed, adversely impact manufacturing yields.

In accordance with the invention, loading variation is reduced or eliminated to avoid variations in dimension by making the pattern factor more uniform across a chip for a given etch process. As previously defined, pattern factor is the ratio of patterned versus unpatterned areas over a region of interest. Making the pattern density more consistent across the chip decreases variation in loading during etchings resulting a more uniform pattern density factor across the chip. This produces more uniform size and taper of etched openings across the chip.

In accordance with the invention, a more uniform pattern factor is provided across the chip to reduce loading variation. In one embodiment, patterns are added in the etch mask in areas of low pattern density and/or adding blockers in areas of high pattern density to achieve a more uniform pattern density across the chip.

To illustrate, a highly patterned area contains greater amount of exposed areas that are to be etched, thus increasing the etch load. Conversely, in a unpatterned or less patterned area, less of the substrate surface is exposed for etching. In such areas, the etch load is lower in comparison to the highly patterned areas. However, adding blockers to the etch mask in highly patterned areas reduces the amount of exposed substrate surface, thereby decreasing the etch load. On the other hand, adding patterns to the etch mask in unpatterned or lesser patterned regions increases the etch load. By doing either one or a combination of both, the pattern factor across the chip becomes more uniform. As a result, more uniform loading occurs during the etch process, which produces more uniform linewidths.

The patterns or blockers can have various sizes, shapes, or configurations. Of course, however, the flexibility afforded to a designer when adding patterns or blockers is limited by design and process parameters. For example, a designer does not have much flexibility in areas which include densely packed active devices with on-pitch or pitch limited requirements. On-pitch or pitch limited means that the spaces separating the features are equal to about the minimum feature size (F). In these regions, the design rules are much more stringent, allowing little or no flexibility to insert patterns or blockers. However, the spacing between features are more relaxed in less densely packed or off-pitched regions, affording a designer more flexibility in implementing either patterns or blockers to produce a more consistent pattern factor across the chip.

In one embodiment, the pattern density or pattern factor across the chip is substantially equalized to the highest pattern density formed by the electrically functional structures within the chip. Typically equalizing the pattern density across the chip involves examining the layout of the chip to determine the pattern density in the on-pitch region or the region comprising the most densely packed electrically functional structures. Such region tends to afford the designer the least flexibility. In a memory device, the region with the highest pattern density formed by the electrically functional structures is the array region, which typically comprises a pattern density of about 40–50%. However, the pattern density in the region having the most densely packed electrically functional structures may differ for other types of ICs.

Once the pattern density of the most densely packed area has been determined, patterns are then added to the remaining less densely packed areas to produce a pattern factor therein which is equal to about that of the most densely packed area. In areas which have higher pattern density created by non-electrically functional structures, blockers are added to decrease the pattern density therein to produce a pattern density equal to about that of the most densely packed electrically functional region. By making the overall pattern density about the same across the substrate, etch loading is more uniform across the chip. As a result, the sidewall passivation and dimension of openings are more consistent across the chip, leading to improved linewidth control.

Figure 3:
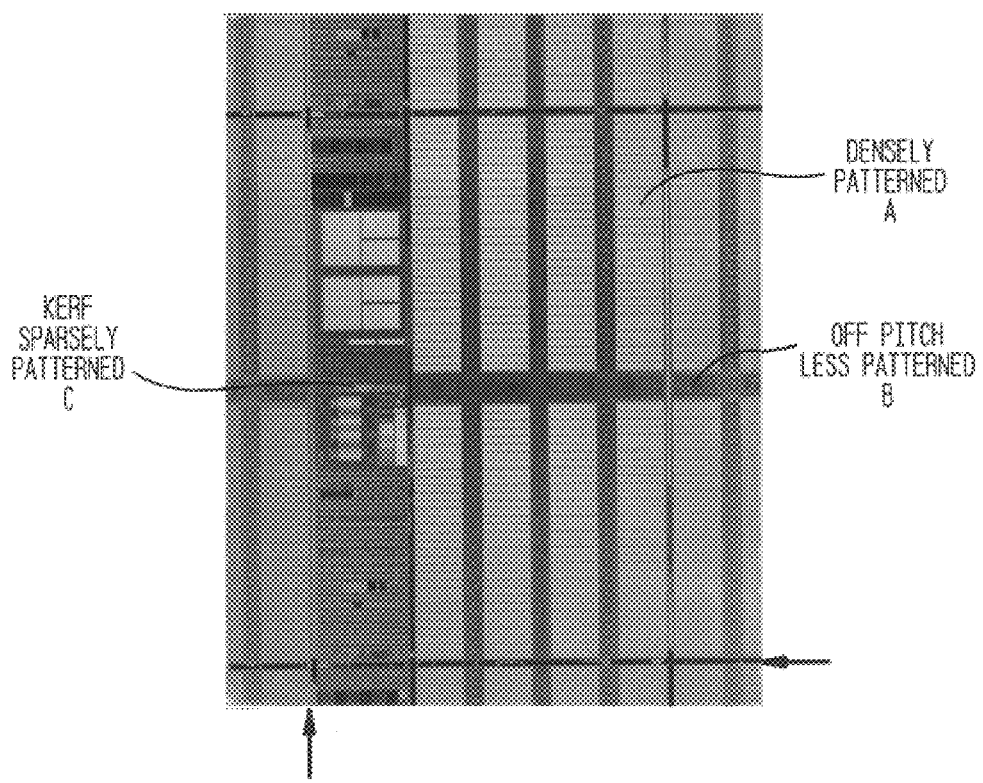
FIG. 3 is a top view of a chip or die having areas of differing pattern density.

FIG. 3 is a top view of a partial design layout for a dynamic random access memory (DRAM) chip. Other memory chip such as synchronous DRAM (SDRAM), static RAM (SRAM), or read only memory (ROM), can be used. Also logic chips including application specific IC (ASIC) or other IC chips can be used.

As shown, the memory chip includes three different types of area or region. Area A is an on-pitch or pitch-limited region of the chip. As a result, area A comprises the highest pattern density. Typically, area A contains an array of memory cells. Area B of the chip is an off-pitch region that has less pattern density than area A. The off-pitch region typically comprises the support circuitry of the DRAM chip. Area C is a sparsely patterned region of the chip. Typically, this region is referred to as the kerf. For a DRAM chip, the pattern factor of area A is about 50%, area B is about 20–30%, and area C is about 5–10%.

In accordance with one embodiment of the invention, patterns are added to areas B and C to increase the pattern factor therein. In one embodiment, the patterns increase the pattern density of the less densely patterned areas B and C so as to result in a more homogenized pattern density or pattern factor across the chip.

Pattern density is increased in the respective areas by adding additional patterns in the lithographic etch mask. The additional patterns can have various shapes, sizes, configurations, provided that they are within design and process parameters. For example, the features created by the patterns are electrically disconnected and do not have any electrical functions (i.e., the openings are made so that they do not connect to a working device or affect any device performance) while serving as a planarization aid.

To illustrate an etch process, a mask is used to expose a resist layer on the surface of the wafer with the desired pattern. The resist layer is then developed to remove either the exposed or unexposed areas, depending on whether a positive or negative resist layer is used. Portions of the wafer unprotected by the resist mask are then etched by, for example, reactive ion etching (RIE). Other etch processes are also useful. Since the amount of materials being etched in various areas across the chip is more uniform, loading variation is reduced. As a result, ACLV is reduced, creating more uniform linewidths across the chip. Thus, a goal of the invention is to bring the pattern density of the photoresist mask to a uniform level across the chip.

For example, the formation of gate conductors in the fabrication of a DRAM chip involves depositing a blanket layer of polysilicon (poly) over the surface of the wafer. Other layers, such as polycides which include a silicide layer formed over poly, are also useful in forming the gate conductors. Typically, a nitride layer is formed over the poly to serve as an etch stop for boarderless contact schemes. Once the various layers of the gate conductor are formed, a resist layer is formed thereover. The resist layer is patterned, selectively exposing portions of the gate conductor layers.

In the array area, the pattern density of the resist is high because of the array wordlines that are to be formed by etching into the gate conductor layers. However, the pattern density of the non-array areas, such as in the support area or the kerf, have less pattern density. To increase uniformity of the pattern density across the chip, patterns are added to the support and kerf regions. As a result, pattern structures are added to otherwise unpatterned areas to decrease loading variation. The additional patterns are electrically isolated from active or functional features, such as the gate conductors of the wordlines. The creation of inert poly structures decreases loading variation, thereby producing more uniform linewidths of, for example, the active gate conductor or wordlines.

Figure 4:
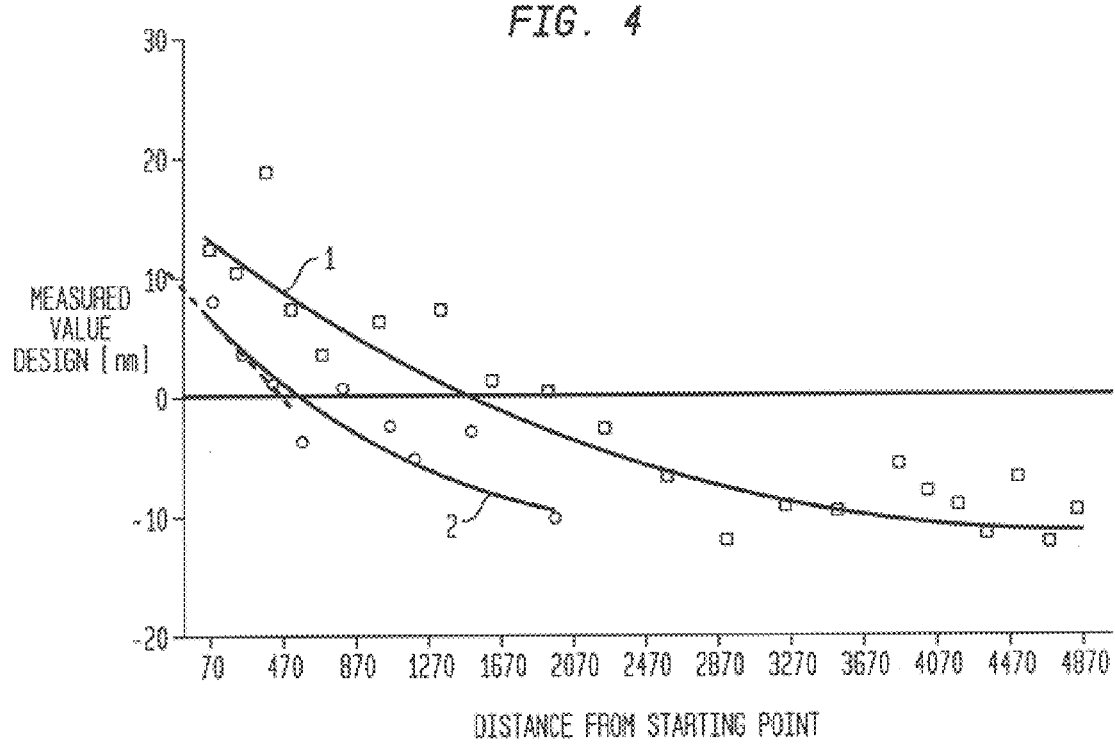
FIG. 4 is a graph of the measured value of linewidths of gate conductors versus distance from low and from medium patterned areas into a high density area on a chip.

FIG. 4 is a graph of measured value minus design value (in nanometers) of a high density area versus the distance from a wide open area (squares) or from a medium density area (circles). The graph shows the influence of pattern factor for a gate conductor level on linewidth in a conventional DRAM layout such as that shown in FIG. 3. Lines adjacent to open areas on the substrate had a wide variation in linewidth depending on how far the lines were from the open area, as shown in FIG. 4. As can be seen from the averaged line marked 1, the linewidth varied from about +13 nm adjacent to open areas shown as "B" in FIG. 3, to linewidths of about −10 nm about 5000 microns away from the open areas.

As shown by the averaged line 2, the measured linewidth was about 10 nm, and decreased to about −10 nm, but now the distance covered was only about 2000 microns from the medium density area "A". Thus the linewidth variation is about 20 nm when the overall patterning factor varies from empty to about a 40% or higher pattern factor.

Figure 5:
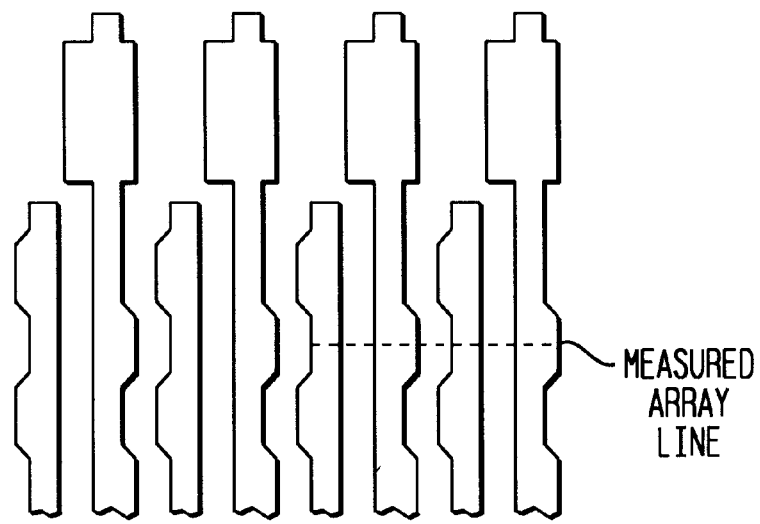
FIG. 5 is a top view of connecting lines for an array of devices.

A substrate was exposed and developed to form a desired photoresist pattern, including added patterns in accordance with the invention so that the overall pattern density of the integrated circuit was about 40–50%. After etching an array of lines as shown in FIG. 5 the linewidths were measured as shown by the arrows.

As described above, one would expect a variation of about 20 nm in linewidth as lines are etched at various places across the chip.

Figure 6:
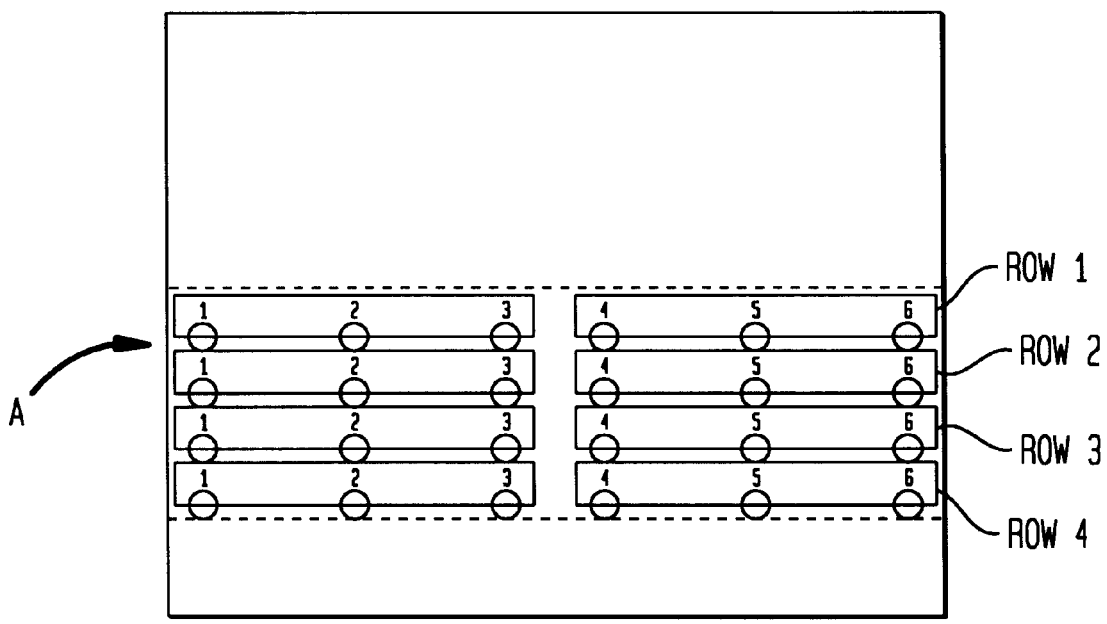
FIG. 6 is a top view of a chip having added patterns so the overall pattern density of the chip is about the same.

The linewidths were measured for four rows of high density arrays at various points along the array, as shown in FIG. 6. The measured results are given below in Table 1, wherein positions 1–6 correspond to positions along the array. Based on the information gained from FIG. 4, one would expect that the top and bottom rows of positions 1–6 would have larger linewidths than the center rows, since they are adjacent to less densely patterned areas, and that the middle rows would have smaller linewidths, since they are adjacent to the adjoining rows of lines to more densely patterned areas.

However, as can be seen from the data of Table I, the added patterning reduced the linewidth variation, and there is no definable difference between etched linewidths adjacent to heavily patterned areas compared to less densely patterned areas. In the Table, "Dev." represents deviation.

TABLE I

|  | Point 1 | Dev. | Point 2 | Dev. | Point 3 | Dev. |
| --- | --- | --- | --- | --- | --- | --- |
| Row 1 | 390 | 2.75 | 389 | 2.0 | 392 | 2.00 |
| Row 2 | 389 | 1.75 | 389 | 2.0 | 392 | 2.00 |
| Row 3 | 390 | 2.75 | 391 | 4.0 | 390 | — |
| Row 4 | 381 | 5.25 | 379 | 8.0 | 386 | 4.00 |
|  | AVG. | DEV. | AV. | DEV. | AV. | DEV. |
|  | 387 | 253.13 | 387 | 4.0 | 390 | 2.00 |
|  | Point 4 | Dev. | Point 5 | Dev. | Point 6 | Dev. |
| Row 1 | 391 | 2.00 | 386 | 2.5 | 393 | 0.25 |
| Row 2 | 383 | 6.00 | 389 | 0.5 | 392 | 0.75 |
| Row 3 | 394 | 5.00 | 391 | 2.5 | 394 | 1.25 |
| Row 4 | 388 | 1.00 | 388 | 0.5 | 392 | 0.75 |
|  | AV. | DEV. | AV. | DEV. | AV. | DEV. |
|  | 389 | 3.50 | 388.5 | 1.5 | 392.8 | 0.75 |

Thus whereas linewidths vary by about 20 nm when areas of differing pattern density are present in an integrated circuit, when extra patterns are added so that the overall pattern density is the same, the linewidths vary by very little, only up to about 3–5 nm or less.

The invention can be carried out prior to any etch step, and is particularly important when etch steps are performed that have tapered openings. An etch mask is generally made so that after the photoresist is exposed and developed, openings in the photoresist are formed where the deposited layer is to be removed. For example, if an aluminum layer is to be etched to remove aluminum except for desired conductive lines, the photoresist covers the aluminum which is to remain and is opened where aluminum is to be removed. In accordance with the present invention however, the totality of the pattern across the whole chip is considered. If there are large unpatterned areas, a further pattern is added to the photomask so that the overall pattern density is about the same across the chip. Thus a dummy pattern will be formed in areas with little or no pattern.

The invention has been described in the form of certain embodiments, but is not meant to be so limited. The invention can be varied in the shape and placement of dummy features, and in the overall pattern density across an integrated circuit. The invention is only meant to be limited by the scope of the appended claims.

What is claimed is:

1. A method of manufacturing a DRAM chip comprising: determining the pattern density of the region within the chip having the most densely packed electrically functional devices; adding patterns in regions of the chip that have a pattern density which is less than that of the pattern density of the most densely packed electrically functional devices; and/or adding blockers in regions having higher density as a result of non-electrically functional devices, wherein adding the blockers and patterns result in a more consistent pattern density across the chip to result in a more uniform across chip line width during etching.

* * * * *